(12) United States Patent
Takahashi

(10) Patent No.: US 7,863,678 B2
(45) Date of Patent: Jan. 4, 2011

(54) INSULATED-GATE FIELD-EFFECT TRANSISTOR

(75) Inventor: Ryoji Takahashi, Saitama (JP)

(73) Assignee: Sanken Electric Co., Ltd. (JP)

( * ) Notice: Subject to any disclaimer, the term of this patent is extended or adjusted under 35 U.S.C. 154(b) by 55 days.

(21) Appl. No.: 12/477,518

(22) Filed: Jun. 3, 2009

(65) Prior Publication Data

US 2009/0236660 A1    Sep. 24, 2009

Related U.S. Application Data

(63) Continuation of application No. PCT/JP2007/073232, filed on Nov. 30, 2007.

(30) Foreign Application Priority Data

Dec. 4, 2006    (JP) .............................. 2006-326811

(51) Int. Cl.
 *H01L 29/76* (2006.01)
 *H01L 29/94* (2006.01)
 *H01L 31/062* (2006.01)
 *H01L 31/113* (2006.01)
 *H01L 31/119* (2006.01)

(52) U.S. Cl. ...................... 257/331; 257/329; 257/330; 257/334; 257/E29.201; 257/E29.26

(58) Field of Classification Search ......... 257/328–331, 257/334, E29.201, E29.26
See application file for complete search history.

(56) References Cited

U.S. PATENT DOCUMENTS

| 7,161,208 | B2 * | 1/2007 | Spring et al. ................. 257/328 |
| 7,176,521 | B2 * | 2/2007 | Kawamura et al. .......... 257/330 |
| 7,211,837 | B2 * | 5/2007 | Tomomatsu ................ 257/156 |
| 7,364,971 | B2 * | 4/2008 | Yamaguchi et al. ......... 438/268 |
| 7,417,266 | B1 * | 8/2008 | Li et al. ...................... 257/135 |
| 7,541,642 | B2 * | 6/2009 | Kawamura et al. .......... 257/331 |
| 7,675,111 | B2 * | 3/2010 | Arai ........................... 257/330 |
| 7,705,396 | B2 * | 4/2010 | Adan ......................... 257/329 |
| 7,800,187 | B2 * | 9/2010 | Matsuura .................... 257/409 |
| 2006/0289928 | A1 * | 12/2006 | Takaya et al. ............... 257/330 |
| 2007/0018243 | A1 * | 1/2007 | Ono et al. ................... 257/330 |
| 2009/0173995 | A1 * | 7/2009 | Takahashi ................... 257/330 |

FOREIGN PATENT DOCUMENTS

| JP | 07-015009 A | 1/1995 |
| JP | 2003-133557 A | 5/2003 |
| JP | 07-142722 A | 6/2003 |
| JP | 2004-221218 A | 8/2004 |

* cited by examiner

*Primary Examiner*—Ida M Soward
(74) *Attorney, Agent, or Firm*—Woodcock Washburn LLP

(57) ABSTRACT

An IGFET that can be turned off when a reverse voltage is applied. Included is a semiconductor substrate having formed therein an n-type drain region, p-type first body region, $p^-$-type second body region, n-type first source region, and $n^+$-type second source region. Trenches etched in the substrate receive gate electrodes via gate insulators. The source electrode is in ohmic contact with both first and second source regions and in schottky barrier contact with the second body region.

7 Claims, 9 Drawing Sheets

US 7,863,678 B2

INSULATED-GATE FIELD-EFFECT TRANSISTOR

CROSS REFERENCE TO RELATED APPLICATIONS

This is a continuation of Application PCT/JP2007/073232, filed Nov. 30, 2007, which claims priority to Japanese Patent Application No. 2006-326811 filed Dec. 4, 2006.

BACKGROUND OF THE INVENTION

This invention relates to an insulated-gate field-effect transistor (IGFET) of vertical channel design such for example as a metal-oxide-semiconductor field-effect transistor (MOSFET), and to a metal of fabricating the same.

A type of IGFET with a large current-carrying capacity, the MOSFET finds use as, for example, a switch in electric circuits. A typical conventional MOSFET has a source electrode in ohmic contact with both source region and body (base) region. As a consequence, between the drain and source electrodes, the current path exists not only through the channel in the body region but, additionally, through a parasitic diode (sometimes referred to as a body diode or built-in diode) created by reason of the pn junction between the drain and body regions. If this known MOSFET has a channel of n-type semiconductor material (nMOSFET), the parasitic diode is reverse biased when the drain electrode is higher in potential than the source electrode, blocking the current flow therethrough. However, under the requirements of the electric circuit incorporating the MOSFET, the drain electrode may be less in potential than the source electrode. In that case the parasitic diode will be forward biased, permitting a current flow therethrough. This feature of the MOSFET is of particularly utility when it is used as a switch in an inverter (DC-to-AC converter) circuit, because then a regenerative current can be made to flow through the parasitic diode.

However, there also exist other circuits that require the prevention of current flow through the parasitic diode. This requirement has so far been met by connecting the MOSFET in series with an external diode having a polarity (orientation) opposite to that of the parasitic diode. The external diode is in fact a reverse blocking diode, preventing a current flow through the MOSFET when the drain electrode is less in potential than the source electrode. A fabrication of this external diode on one and the same semiconductor substrate as the MOSFET is objectionable by reasons of the unnecessarily large size substrate required and the higher manufacturing cost of the resulting composite integrated device. A manufacture of the MOSFET and the external diode on separate semiconductor substrates is also undesirable for the larger size and expensiveness of the two devices combined. Moreover, power loss will inevitably occur as a result of the flow of the same current through the external diode as through the MOSFET. The connection of the external diode in series with the MOSFET brings about the additional inconvenience that the MOSFET current is uncontrollable when the drain electrode is less in potential than the source electrode, that is, when a reverse voltage is being impressed to the MOSFET.

With a view to defeating the problems arising from use of the external diode in combination with the MOSFET of the noted prior art construction, Japanese Unexamined Patent Publication No. 7-15009 suggests an advanced planar MOSFET where the source electrode is in schottky contact with the body region. FIG. 1 is a sectional illustration of this advanced prior art planar MOSFET, and FIG. 2 its equivalent circuit diagram.

Referring more specifically to FIG. 1, the prior art planar MOSFET comprises a semiconducting silicon substrate 1', a drain electrode 2', a source electrode 3', a gate electrode 4', and a gate insulator film 5'. The semiconductor substrate 1' comprises a first drain region 6' of $n^+$-type semiconductor material with a high impurity concentration, a second drain (or drift) region 7' of $n^-$-type semiconductor material with a low impurity concentration, a first body (or base) region 8' of p-type semiconductor material with a high impurity concentration, a second body (or base) region 9' of $p^-$-type semiconductor material with a low impurity concentration, and a source region 10' of $n^+$-type semiconductor material with a high impurity concentration. The substrate 1' has a pair of opposite major surfaces $1_a'$ and $1_b'$. The drain electrode 2' is formed on the second major surface $1_b'$ in ohmic contact with the first drain region 6'. The source electrode 3' is formed on the first major surface $1_a'$ in ohmic contact with the $n^+$-type source region 10' and schottky contact with the $p^-$-type second body region 9'. Also formed on the first major surface $1_a'$, the gate electrode 4' is opposed to both p-type first body region 8' and $p^-$-type second body region 9' via the gate insulator film 5'.

In the prior art planar MOSFET constructed as in FIG. 1, upon application of such a voltage between drain electrode 2' and source electrode 3' as to make the former higher in potential than the latter, and of a voltage sufficiently high to turn on the MOSFET between gate electrode 4' and source electrode 3', then an n-type channel 13' will be created in the surfaces of the first body region 8' and second body region 9', as indicated by the dashed lines in FIG. 1. Then drain current will flow along the path sequentially comprising the drain electrode 2', first drain region 6', second drain region 7', channel 13', $n^+$-type source region 10', and source electrode 3'.

The circuit diagram of FIG. 2, equivalently depicting how the prior art planar MOSFET of FIG. 1 is electrically circuited, indicates that it comprises a first and a second pn-junction diode $D_1$ and $D_2$ and a schottky-barrier diode $D_3$ in addition to an FET switch $Q_1$. The first pn-junction diode $D_1$ is a parasitic (built-in) diode based upon the pn junction between n-type second drain region 7' and p-type first body region 8'. The second pn-junction diode $D_2$ is another such diode based upon the pn junction between $p^-$-type second body region 9' and $n^+$-type source region 10'. The schottky-barrier diode $D_3$ is based upon the schottky junction between source electrode 3' and $p^-$-type second body region 9'. Polarized to be reverse biased when the drain electrode 2' is higher in potential than the source electrode 3', the first pn-junction diode $D_1$ is connected in inverse parallel with the FET switch $Q_1$. The second pn-junction diode $D_2$ has a polarity opposite to that of the first pn-junction diode $D_1$ and is connected in series therewith. In the noted more conventional MOSFET having no schottky-barrier diode $D_3$, this part of the device is short-circuited, so that the second pn-junction diode $D_2$ has no function whatsoever and does not appear in the equivalent circuit. The schottky-barrier diode $D_3$ has a polarity opposite to that of the first pn-junction diode $D_1$ and is connected in series with the first pn-junction diode $D_1$ and in parallel with the second pn-junction diode $D_2$.

Such being the construction of the prior art planar MOSFET shown in FIGS. 1 and 2, the first pn-junction diode $D_1$ will be reverse biased, and the schottky-barrier diode $D_3$ forward biased, when the drain electrode 2' is higher in potential than the source electrode 3'. Thus the device operates just like the more conventional MOSFET set forth above. Conversely, when the drain electrode 2' is less in potential than the source electrode 3', both schottky-barrier diode $D_3$ and second pn-junction diode $D_2$ will be reverse biased, blocking reverse current flow through paths other than the channel.

However, the prior art planar MOSFET of FIG. 1 possesses the following shortcomings:

1. The $p^-$-type second body region 9' becomes higher in potential than the $n^+$-type source region 10' because of the potential difference of approximately 0.2 volt due to the schottky barrier between source electrode 3' and $p^-$-type second body region 9'. For this reason, when the drain electrode 2' is higher in potential than the source electrode 3', there occurs an inflow or injection of electrons from $n^+$-type source region 10' to $p^-$-type second body region 9'. The current flowing between drain electrode 2' and source electrode 3' by reason of this electron injection is a leak current. The antivoltage strength between the drain and source of any device of this type is customarily assessed in the semiconductor industry in terms of the magnitude of leak current: The more leak current, the lower is the rating of the drain-source antivoltage strength of the device.

2. The leak current now under consideration is controllable by lowering the impurity concentration of that part of the $n^+$-type source region 10' which adjoins the second body region 9'. Being formed by impurity diffusion, the $n^+$-type source region 10' grows less in impurity concentration from the first major surface $1_a$' toward the second major surface $1_b$' of the substrate 1'. It might be contemplated to lower the impurity concentration of the required part of the $n^+$-type source region 10' by making this region 10' deeper. The deepening of the $n^+$-type source region 10' would necessitate that of the two body regions 8' and 9' as well. With the body regions 8' and 9' and source region 10' thus deepened, more lateral diffusions of both p- and n-type impurities would take place, with the result that these regions would occupy greater surface areas of the chip. Experiment has proved that the chip surface of the substrate 1' becomes as large as 1.7 times that of the known planar MOSFET having no schottky-barrier diode, making it impossible to make the device smaller in size. Also, by deepening the body regions 8' and 9' and source region 10', the maximum depth of the second drain region 7' (i.e., the distance between its surface exposed at the first major surface $1_a$' of the substrate 1' and its boundary with the $n^+$-type first drain region 6') would be 1.5 times that in the prior art planar MOSFET having no schottky-barrier diode. As a result, the on-resistance between the drain electrode 2' and source electrode 3' of the prior art planar MOSFET having the schottky-barrier diode as in FIG. 1 would become as high as, say, approximately four times that of the prior art planar MOSFET having no schottky-barrier diode. For this drawback the prior art planar MOSFET of FIG. 1 has not been placed on the market.

SUMMARY OF THE INVENTION

It is therefore an object of this invention to reduce the size and on-resistance of an IGFET of the type having the source electrode in schottky contact with the body region.

For the attainment of the foregoing object the present invention provides an IGFET comprising: (a) a semiconductor substrate having a first and a second opposite major surface extending parallel to each other, and at least a pair of trenches extending from the first major surface of the substrate and terminating short of the second major surface of the substrate; (b) a drain region of a first conductivity type having a surface exposed at the second major surface of the substrate and having a thickness not less than a spacing between the second major surface of the substrate and each of the trenches; (c) a first body region of a second conductivity type with a first prescribed impurity concentration, the first body region being disposed contiguous to both the drain region and the trenches so as to prevent the drain region from being exposed at the first major surface of the substrate between the pair of trenches; (d) a second body region of the second conductivity type with a second prescribed impurity concentration less than the first prescribed impurity concentration, the second body region being disposed between the pair of trenches and contiguous to the first body region and having a surface exposed at the first major surface of the substrate; (e) a source region of the first conductivity type disposed between the pair of trenches and contiguous to both the second body region and the trenches, the source region having a surface exposed at the first major surface of the substrate; (f) a drain electrode disposed on the second major surface of the substrate in ohmic contact with the drain region; (g) a source electrode disposed on the first major surface of the substrate in ohmic contact with the source region and in schottky contact with the second body region; (h) a gate insulator in each trench; and (i) a gate electrode received in each trench via the gate insulator and held opposite those parts of the substrate where channels are to be formed.

Preferably, the drain region comprises: (a) a first drain region having a surface exposed at the second major surface of the substrate, the first drain region being less thick than the spacing between the second major surface of the substrate and each of the trenches; and (b) a second drain region contiguous to the first drain region, the second drain region being less in first conductivity type impurity concentration than the first drain region and having a thickness not less than a distance between the first drain region and each trench. The trenches in the substrate are each thick enough to reach the second drain region.

Preferably, the source region comprises: (a) a first source region contiguous to both the second body region and the trenches and having a surface exposed at the first major surface of the substrate; and (b) a second source region of higher impurity concentration than the first source region, the second source region being contiguous to the first source region and having a surface exposed at the first major surface of the substrate.

Preferably, the second drain region has a thickness less than a distance between the first major surface of the substrate and a pn junction between the second drain region and the first body region.

Preferably, the first body region comprises: (a) a first body region disposed between and spaced from the pair of trenches; and (b) a second body region disposed alongside the pair of trenches, the second body region being higher in second conductivity type impurity concentration than the first body region.

Preferably, the first and the second body region are regions where the lifetime of minority carriers has been shortened by electron beam irradiation.

Preferably, the invention may further comprise: (a) a gate control circuit for delivering to the gate electrode a gate control signal for selectively causing conduction between the drain electrode and the source electrode; (b) first auxiliary switch means for short-circuiting the source electrode and the gate electrode in order to cause nonconduction between the drain electrode and the source electrode when the drain electrode is higher in potential than the source electrode; and (c) second auxiliary switch means for short-circuiting the drain electrode and the gate electrode in order to cause nonconduction between the drain electrode and the source electrode when the drain electrode is less in potential than the source electrode. The gate control circuit and first and second auxiliary switch means are considered parts of the IGFET in this application.

The present invention also provides a method of fabricating an insulated-gate field-effect transistor of the above summarized construction. The method may be summarized as comprising: (a) providing a semiconductor substrate having a first and a second opposite major surface, a drain region of a first conductivity type exposed at the second major surface of the substrate, and a first body region of a second conductivity type contiguous to the drain region; (b) forming at least a pair of trenches in the substrate, each trench extending from the first major surface of the substrate to the drain region; (c) forming gate insulator films in the trenches; (d) forming gate electrodes in the trenches so as to be opposed to channel-forming parts of the substrate via the gate insulator films; (e) forming, either before or after the formation of the trenches, a second body region of the second conductivity type by selectively diffusing a first conductivity type impurity into the preformed first body region from the first major surface of the substrate in a concentration sufficiently low to avoid a change in the second conductivity type of the first body region, the second body region being contiguous to the first body region and less in second conductivity type impurity concentration than the first body region; (f) forming, either before or after the formation of the trenches, a source region contiguous to the second body region by selectively diffusing a first conductivity type impurity into the substrate from the first major surface thereof; (g) forming a drain electrode on the second major surface of the substrate, the drain electrode being in ohmic contact with the drain region; and (h) forming a source electrode on the first major surface of the substrate, the source electrode being in ohmic contact with the source region and schottky contact with the second body region.

Preferably, the source region comprises: (a) a first source region of the first conductivity type contiguous to the second body region; and (b) a second source region of the first conductivity type with an impurity concentration higher than that of the first source region, the second source region being contiguous to the first source region and having a surface exposed at the first major surface of the substrate.

Preferably, the method further comprises a step of injecting the ions of a second conductivity type impurity into the channel-forming parts of the first body region via the trenches thereby forming body regions which are higher in second conductivity type impurity concentration than the rest of the first body region.

Preferably, the method further comprises a step of irradiating at least the first and the second body region with an electron beam in order to shorten the lifetime of minority carriers therein.

The IGFET according to the invention gains the following advantages:

1. Channels are formed vertically along the trenches in the substrate, making it unnecessary to expose the drain region at the first major surface of the substrate between the pair of trenches. It is therefore unnecessary to form the first body region by selective diffusion of impurities between the pair of trenches. The present invention thus overcomes the hitherto encountered problem of undesired lateral expansion of the body region due to the lateral diffusion of impurities in the course of the selective diffusion for formation of the body (base) region in the prior art planar IGFET. Therefore, it is possible to reduce the size of the IGFET.

2. The drain region is not exposed at the first major surface of the substrate between the pair of trenches, so that the drain region can be made less thick than in the prior art IGFET of FIG. 1, with the consequent reduction of the on-resistance of the IGFET. In other words, the present invention makes it possible to reduce the distance between the channels and the drain electrode for a smaller on-resistance of the IGFET.

DESCRIPTION OF THE PREFERRED EMBODIMENTS

Figure 1:
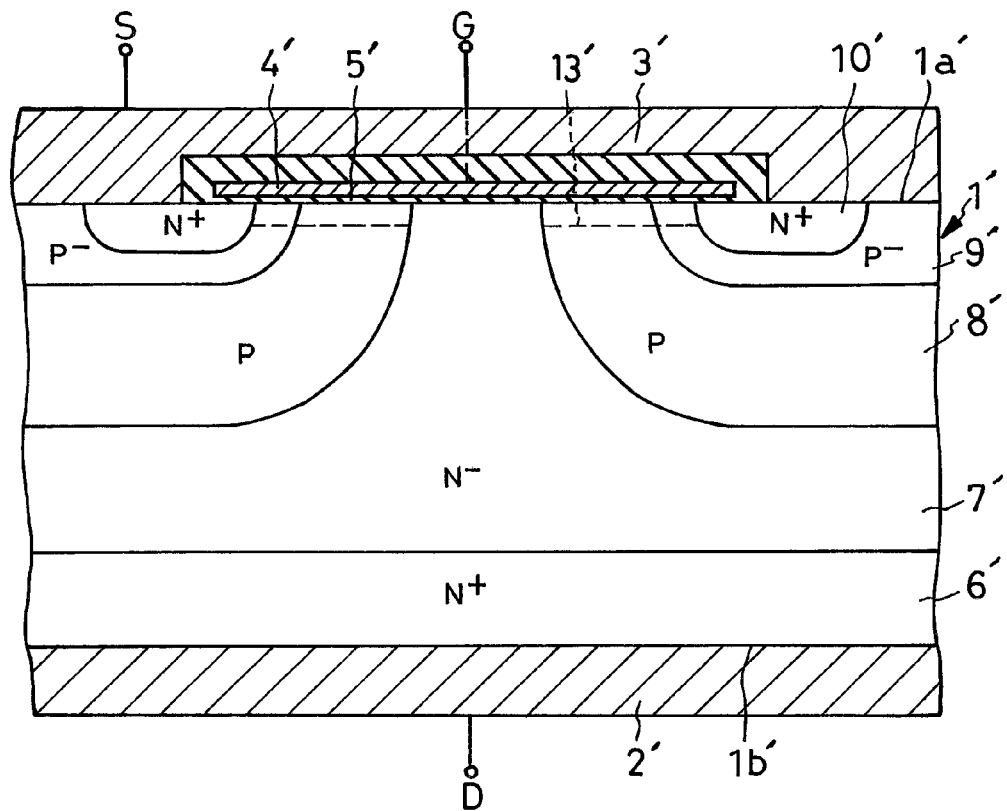
FIG. 1 is a section through the prior art MOSFET.
Figure 2:
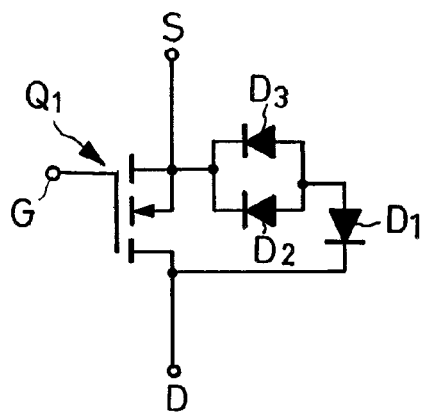
FIG. 2 is an equivalent circuit diagram of the prior art MOSFET of FIG. 1.

The present invention will now be described more specifically with reference to FIGS. 3-18. Like reference characters will be used to denote like parts in all these figures. The reference characters in FIG. 1 are shown primed, while those in FIG. 3 are not, in order to distinguish like parts of the prior art and the instant invention from each other.

First Embodiment

Figure 3:
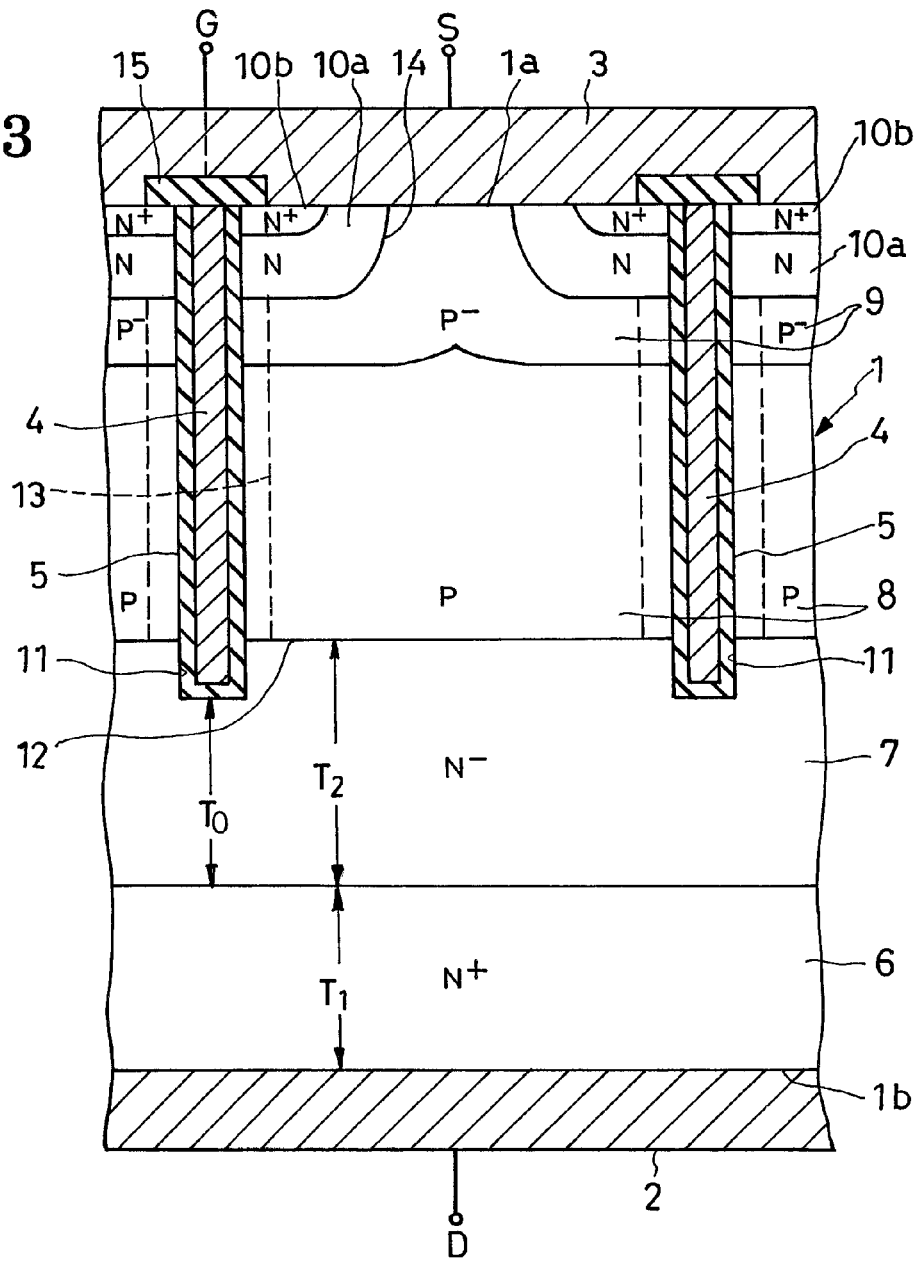
FIG. 3 is a section through a first preferred form of IGFET according to the present invention.

Referring first to FIG. 3 the vertical-channel IGFET embodying the invention comprises a semiconductor substrate (or chip) 1, a drain electrode 2, a source electrode 3, gate electrodes 4, and gate insulators 5. The semiconductor substrate 1 is constituted of a first drain region 6 of high impurity concentration made from $n^+$-type semiconducting silicon, a second drain region 7 of low impurity concentration made from $n^-$-type semiconducting silicon, a first body (or base)

region 8 made from p-type semiconducting silicon, a second body region 9 of low impurity concentration made from p⁻-type semiconducting silicon, a first source regions $10_a$ of relatively low impurity concentration made from n-type semiconducting silicon, and a second source regions $10_b$ of higher impurity concentration made from n⁺-type semiconducting silicon. A pair of trenches 11 extend from the first major surface $1_a$ of the substrate 1 toward the second major surface $1_b$, terminating short of the latter.

The first drain region 6 of n⁺-type (first conductivity type) has a surface exposed at the second major surface $1_b$ of the substrate 1 and is relatively high in n-type impurity concentration (e.g., from $1\times10^{19}$ cm⁻³ to $1\times10^{20}$ cm⁻³). The thickness $T_1$ of this drain region 6 is less than the distance between the second major surface $1_b$ of the substrate 1 and the bottom of each trench 11.

The n⁻-type second drain region 7, sometimes referred to as the drift region, is disposed contiguous to the first drain region 6 and made less in impurity concentration (e.g., $1\times10^{15}$ cm⁻³-$1\times10^{17}$ cm⁻³) than the first drain region 6 with a view to a higher antivoltage strength of the IGFET. The thickness $T_2$ of this second drain region 7 is not less than the distance $T_0$ between the first drain region 6 and each trench 11. The second drain region 7 is not exposed at the first major surface $1_a$ of the substrate 1, at least not between the pair of parallel trenches 11.

In this particular embodiment the second drain region 7 is not only not exposed at the first major surface $1_a$ of the substrate 1 between the pair of trenches 11 but in any other parts of the entire substrate. However, as indicated by the dot-and-dash lines in FIG. 4, the second drain region 7 could be exposed at the first major surface $1_a$ of the substrate 1 in places other than between the pair of trenches 11, that is, in places outside the outmost ones of all the trenches in the substrate. Also, the first and the second body regions 8 and 9 and the first and the second source regions $10_a$ and $10_b$ may be formed outside the outmost ones of all the trenches in the substrate. Carriers are accelerated by the field in the second drain region 7 of low impurity concentration, so that this second drain region 7 functions like the known high resistance collector region of the bipolar transistor.

Each of the trenches 11 extends from the first major surface $1_a$ of the substrate 1 toward the second major surface $1_b$ thereof and terminates in the second drain region 7. However, in a broader aspect of the instant invention, each trench 11 may extend either into the second drain region 7, as shown, or to the boundary between first drain region 6 and second drain region 7. Each trench 11 is at right angles with the major surfaces $1_a$ and $1_b$ of the substrate 1. It is understood that, as is apparent from FIG. 4, the substrate 1 provides a plurality of IGFET cells defined by the trenches 11. FIG. 3 represents one pair of such trenches and one IGFET cell incorporating the same.

The p-type first body or base region 8 is contiguous to both second drain region 7 and trenches 11. Created by p-type impurity diffusion into the substrate 1 from its first major surface $1_a$, the first body region 8 contiguously overlies all the part of the second drain region 7 that lies between the pair of trenches 11. The second drain region 7 is therefore not exposed at the first major surface $1_a$ of the substrate 1 between the pair of trenches 11. The first body region 8 is understood to be formed not only between the trenches 11 but peripherally of the substrate 1, that is, outwardly of all the trenches 11 in the substrate. However, the first body region 8 may not be formed, either in part or whole, peripherally of the substrate 1 in order that the second drain region 7 may be exposed at the first major surface $1_a$ of the substrate 1 at these peripheral parts of the substrate.

The pn junction 12 between second drain region 7 and first body region 8 extends parallel to both major surfaces $1_a$ and $1_b$ of the substrate 1. This pn junction 12 provides the first pn-junction diode seen at $D_1$ in the equivalent circuit diagram of FIG. 5. The distance between the first major surface $1_a$ of the substrate 1 and the pn junction 12 is greater than the thickness $T_2$ of the second drain region 7; that is, the second drain region 7 is less thick than the distance between the first major surface $1_a$ of the substrate 1 and the pn junction 12. Being formed by p-type impurity diffusion from the first major surface $1_a$ of the substrate 1, the first body region 8 lessens in impurity concentration from the first major surface $1_a$ of the substrate 1 toward the second $1_b$. The mean p-type impurity concentration (e.g., $1\times10^{16}$ cm⁻³-$1\times10^{17}$ cm⁻³) of the first body region 8 is higher than the n-type impurity concentration of the second drain region 7. The first body region 8 has its mean impurity concentration so predetermined as to provide the n-type channels 13 upon voltage application to the gate electrodes 4.

The p⁻-type second body or base region 9 is contiguous to both first body region 8 and trenches 11 and has a surface exposed at the first major surface $1_a$ of the substrate 1.

Figure 5:
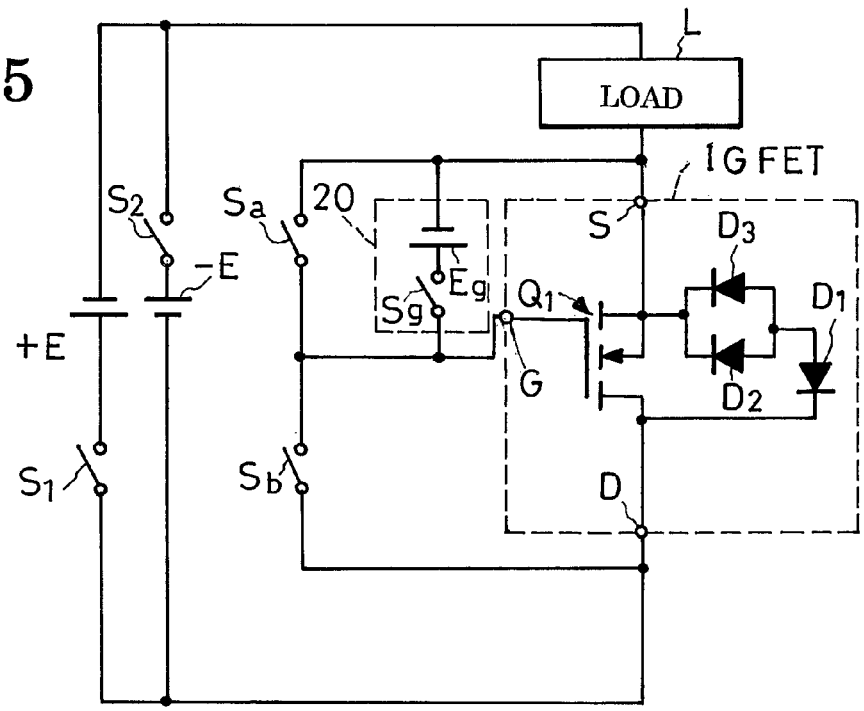
FIG. 5 is a schematic electrical diagram of the equivalent circuit of the IGFET of FIG. 3 shown together with a drive circuit therefor.

The source electrode 3 is in schottky contact with the exposed surface of the second body region 9, providing a schottky barrier diode (SBD) indicated at $D_3$ in FIG. 5. In order to make the reverse antivoltage strength of this SBD $D_3$ not less than 10 volts, the second body region 9 has its surface impurity concentration lower than that of the first body region 8 (e.g., not more than $1\times10^{18}$ cm⁻³).

The n-type first source regions $10_a$ are contiguous to both second body region 9 and respective trenches 11 and have surfaces exposed at the first major surface $1_a$ of the substrate 1. Being formed by selective diffusion of n-type impurities, the first source regions $10_a$ progressively lower in impurity concentration as they extend away from the substrate first major surface $1_a$. The first source regions $10_a$ and second body region 9 have pn junctions 14 therebetween, providing a second pn-junction diode $D_2$ in FIG. 5. The second pn-junction diode $D_2$ is desired to possess a reverse antivoltage strength not less than that of the SBD $D_3$. The impurity concentration of the first source regions $10_a$ must therefore be sufficiently high (e.g., $1\times10^{16}$ cm⁻³-$1\times10^{18}$ cm⁻³) to impart the desired reverse antivoltage strength to the second pn-junction diode $D_2$.

The n⁺-type second source regions $10_b$ are contiguous to the respective first source regions $10_a$ and respective trenches 11 and have surfaces exposed at the first major surface $1_a$ of the substrate 1. The second source regions $10_b$ have an impurity concentration (e.g., $1\times10^{18}$ cm⁻³-$1\times10^{20}$ cm⁻³) higher than that of the first source regions $10_a$.

Overlying the first major surface $1_a$ of the substrate 1, the source electrode 3 is in ohmic contact with both source regions $10_a$ and $10_b$ and in schottky contact with the second body region 9. The source electrode 3 is made from metal such for example as aluminum or titanium or from a silicide and is electrically coupled to the source terminal shown explanatorily at S.

The drain electrode 2 is made from metal such for example as aluminum, makes ohmic contact with the n⁺-type first drain region 6 at the second major surface $1_b$ of the substrate 1, and is electrically coupled to the drain terminal indicated explanatorily at D.

The gate insulators 5 take the form of silicon oxide films on the surfaces defining the trenches 11. The gate electrodes 4 are of impurity-doped polycrystalline silicon filled in the trenches 11 via the gate insulators 5. The doped polycrystalline silicon is as electroconductive as metal, making it possible for the gate electrodes 4 to function as such. The gate electrodes 4 could be metal made, though. Strictly speaking, polycrystalline silicon is not a metal but is functionally equivalent thereto, so that the IGFET with the polycrystalline silicon gate might be called a MOSFET. The source electrode 3 is electrically isolated from each gate electrode 4 by an insulator 15. The gate electrode 4 is electrically connected to the gate terminal G via that part of the substrate surface $1_a$ which is left uncovered by the source electrode 3.

The IGFET of the foregoing physical configuration is electrically circuited as drawn equivalently in FIG. 5 and therein shown together with means for controllably driving the same. Electrically similar in design to its prior art counterpart with a schottky-barrier diode, the IGFET according to the present invention comprises an FET switch $Q_1$, two parasitic pn-junction diodes $D_1$ and $D_2$, and a parasitic SBD $D_3$. The first pn-junction diode $D_1$ is reversely connected between drain terminal D and source terminal S. Both second pn-junction diode $D_2$ and SBD $D_3$ are forwardly connected between drain terminal D and source terminal S via the first pn-junction diode $D_1$.

A first DC source +E and second DC source −E are provided for driving the IGFET. The first DC source +E has its positive terminal connected to the drain terminal D of the IGFET via a first switch $S_1$ and its negative terminal to the source terminal S of the IGFET via a load L. The second DC source −E has its positive terminal connected to the source terminal S of the IGFET via a second switch $S_2$ and the load L and its negative terminal connected to the drain terminal D of the IGFET. Therefore, when the first switch $S_1$ is closed, a forward voltage is applied to the IGFET, making the drain terminal D higher in potential than the source terminal S. When the second switch $S_2$ is closed, on the other hand, a reverse voltage is applied to the IGFET, making the source terminal S higher in potential than the drain terminal D. The DC sources +E and −E and switches $S_1$ and $S_2$ are replaceable by an AC source or a bidirectional voltage generator.

Connected between the source terminal S and gate terminal G of the IGFET is a gate control circuit 20 comprising a gate control voltage source $E_g$ and gate switch $S_g$. The gate switch $S_g$, which may take the form of a transistor, when turned on causes a gate control voltage to be impressed from its source $E_g$ to the gate terminal G. A change in the gate control voltage amplitude results in a change in the drain current of the IGFET.

With continued reference to FIG. 5 the IGFET control circuit illustrated therein comprises two auxiliary switches $S_a$ and $S_b$ for both bidirectional switching and bidirectional control of the IGFET. The first auxiliary switch $S_a$ is connected between the source terminal S and gate terminal G of the IGFET, and the second auxiliary switch $S_b$ between the gate terminal G and drain terminal D of the IGFET. Although shown as mechanical switches for ease of understanding, the auxiliary switches $S_a$ and $S_b$ should preferably be transistors or like controllable electronic switches.

The first auxiliary switch $S_a$ is to be turned on when the first switch $S_1$ is on, with the consequent application of a voltage from the DC source +E between the drain terminal D and source terminal S of the IGFET and, at the same time, when the gate switch $S_g$ is off. The closure of the first auxiliary switch $S_a$ provides a short circuit between source terminal S and gate terminal G. As these terminals G and S thus become equal in potential, the channels 13 indicated by the broken lines in FIG. 3 will disappear, thereby positively interrupting the drain current. Therefore, during the application of a positive voltage between the drain and source terminals D and S, the antivoltage strength of the IGFET is approximately equal to that of the first pn-junction diode $D_1$.

The second auxiliary switch $S_b$, on the other hand, is to be turned on when the second switch $S_2$ is on, with the consequent application of a reverse voltage between the drain terminal D and source terminal S of the IGFET, while the gate switch $S_g$ is off. The closed second auxiliary switch $S_b$ provides a short circuit between drain terminal D and gate terminal G. Thus, upon closure of the second auxiliary switch $S_b$ during the application of a reverse voltage between the drain and source of the IGFET, the gate terminal G gains the same negative potential as does the drain terminal D, so that the channels 13 are extinguished to interrupt the drain current. As a result, when a reverse voltage is applied between the drain and source of the IGFET and the channels 13 are open, the antivoltage strength of the IGFET depends upon that of the second pn-junction diode $D_2$ and of the SBD $D_3$.

When the two auxiliary switches $S_a$ and $S_b$ are both off, the width of the channel 11 and therefore the drain current is controllable by the gate control circuit 20 either when a forward voltage from the first DC source +E or a reverse voltage from the second DC source −E is being applied to the IGFET. In other words, the magnitude of the drain current is variable in terms of the amplitude of the gate control voltage from its source $E_g$.

The gate control circuit 20 is shown in FIG. 5 as having the gate switch $S_g$. It is possible, however, to omit this gate switch and permanently connect the gate control voltage (signal) source $E_g$ between source terminal S and gate terminal G. Let it now be assumed that, contrary to the showing of FIG. 5, the gate control voltage source $E_g$ is permanently connected between source terminal S and gate terminal G and that a forward voltage is being impressed from its source +E between the drain and source of the IGFET. If then the first auxiliary switch $S_a$ is turned on, the gate and source of the IGFET will be short-circuited. The IGFET will go off as its gate and source are at the same negative potential. On the other hand, if the second auxiliary switch $S_b$ is turned on while a reverse voltage is being impressed between the drain and source of the IGFET from its source −E, then the drain and gate of the IGFET will be short-circuited. The IGFET will go off as the gate terminal G gains a negative potential. Thus the IGFET lends itself to use as a bidirectional switch.

Figure 4:
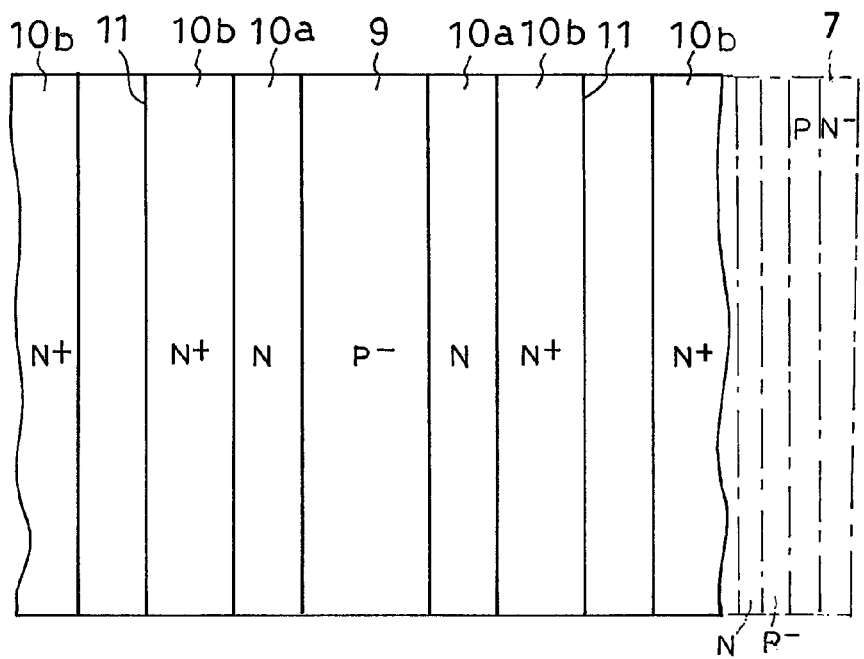
FIG. 4 is a plan view showing the first major surface of the semiconductor substrate of the IGFET of FIG. 3.

Reference will now be had to FIGS. 6-12 for explanation of a method of making the IGFET of FIGS. 3 and 4 according to the present invention. In these FIGS. 6-12 the reference characters designating the various regions of the substrate in the finished IGFET of FIG. 3 will be used to refer also to the substrate regions as they first appear in the course of fabrication.

Figure 6:
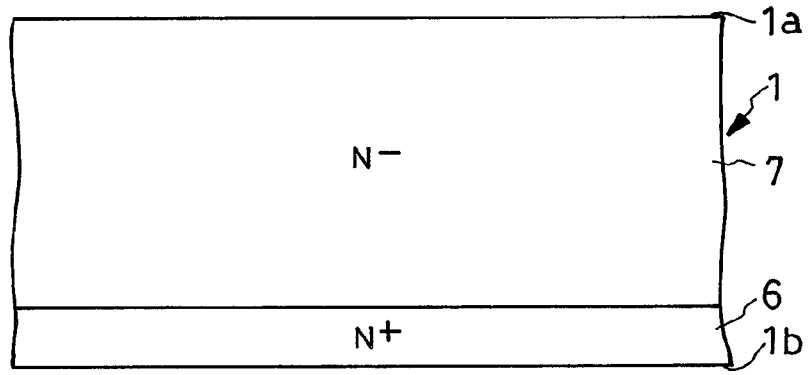
FIG. 6 is a section through a semiconductor substrate at the start of the fabrication of the IGFET of FIG. 3.

First, as seen in FIG. 6, there is prepared the semiconducting silicon substrate 1 having the $n^+$-type first drain region 6 and $n^-$-type second drain region 7. The first drain region 6 may be formed conventionally by diffusion of n-type impurities into the substrate 1 from its second major surface $1_b$ into a significantly higher concentration than in the rest of the substrate, although this region 6 might be grown by epitaxy.

Figure 7:
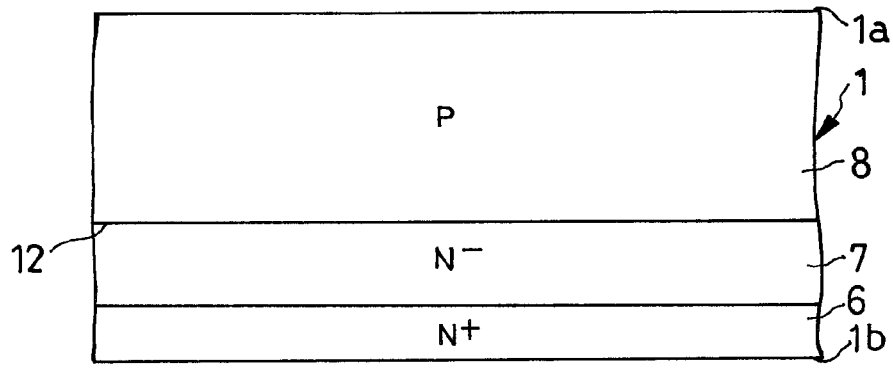
FIG. 7 is a section through the substrate of FIG. 6 after the creation of the p-type first body region therein.

Then, as illustrated in FIG. 7, the first body region 8 is created 7 by diffusing boron or like p-type impurities into part of the preexisting second drain region 7 of the substrate 1 from its first major surface $1_a$. So formed, the first body region 8 will occupy the p-doped part of the preexisting second drain region, the rest of which now becomes the finished second drain region 7. It will be noted that the first body region 8 is formed not by selective diffusion but by nonselective diffusion from all over the first major face $1_a$ of the substrate 1, so that the pn junction between second drain region 7 and first body region 8 will extend parallel to the major surfaces $1_a$ and $1_b$ of the substrate. The first body region 8 might be formed by epitaxy, though.

Figure 8:
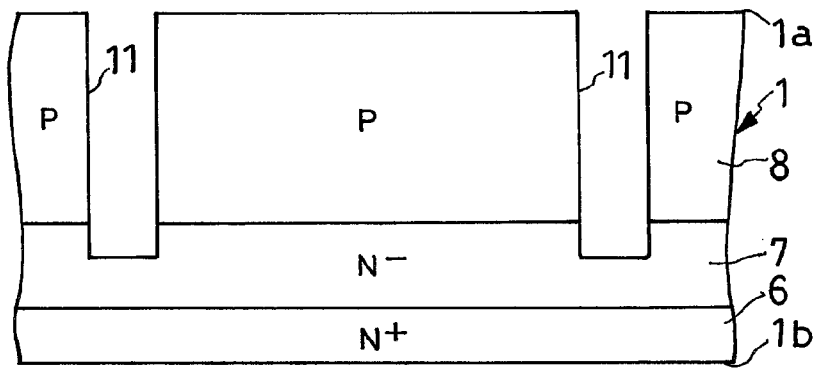
FIG. 8 is a section through the substrate after the creation of trenches therein.

Then the trenches 11 are cut in the substrate 1 as in FIG. 8 by anisotropic etching from its first major surface $1_a$. Each trench 11 should extend down into the second drain region 7. Alternatively, the trenches 11 might be formed either after the creation of the second body region 9 as in FIG. 10, after the creation of the first source regions $10_a$ as in FIG. 11, or after the creation of the second source regions $10_b$ as in FIG. 12.

Figure 9:
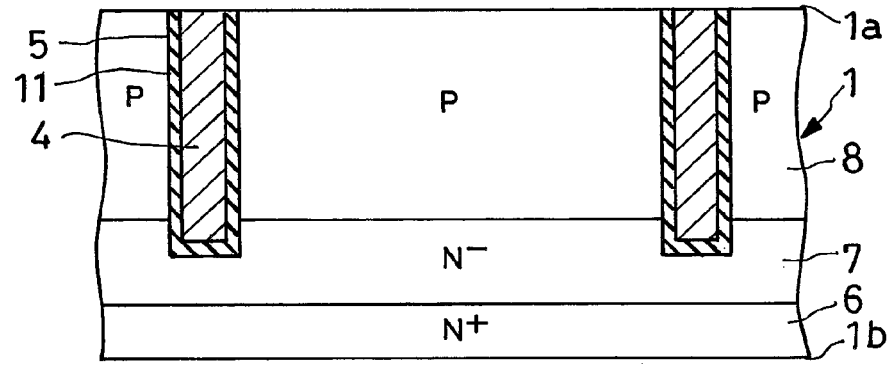
FIG. 9 is a section through the substrate after the creation of gate insulators and gate electrodes in the trenches.

The next step is the creation, by thermal oxidation, of the gate insulator films 5, FIG. 9, on all the wall surfaces of the trenches 11. The thus-formed gate insulator films 5 are of silicon oxide. As depicted also in FIG. 9, the gate electrodes 4 of electroconductive polycrystalline silicon are then formed in the trenches 11 via the gate insulator films 5. Notwithstanding the showing of FIG. 9, the gate electrodes 4 need not be flush with the first major surface $1_a$ of the substrate 1 but may either protrude from or be buried in the trenches 11.

Figure 10:
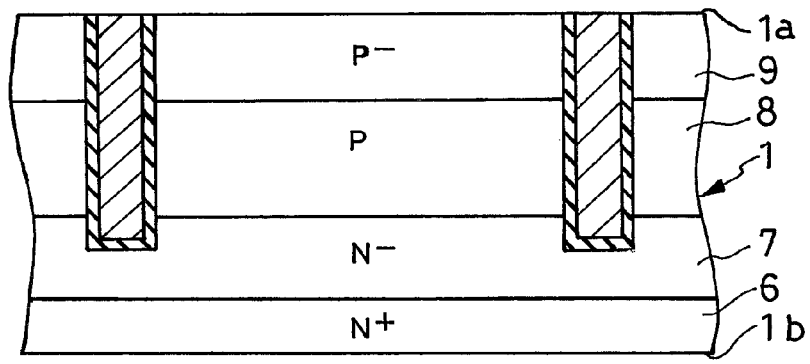
FIG. 10 is a section through the substrate after the creation of the $p^-$-type second body region therein.

Then the $p^-$-type second body region 9 is formed as in FIG. 10 by diffusing phosphor or like n-type impurities into the first body region 8 from the first major surface $1_a$ of the substrate 1, with a concentration such that no change in conductivity type (from p to n type) takes place. This n-type impurity diffusion is intended to lessen, rather than invert, the p-type conductivity of the preformed first body region 8, providing the second body region 9 with a p-type impurity concentration less than that of the first body region 8.

Figure 11:
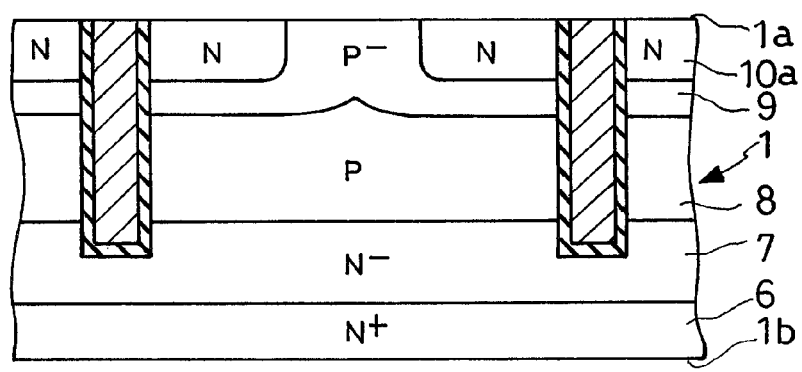
FIG. 11 is a section through the substrate after the creation of the n-type first source regions therein.

Then, as indicated in FIG. 11, the n-type first source regions $10_a$ are formed in the second body region 9 by selective diffusion of phosphor or like n-type impurities. This creation of the first source regions $10_a$ will cause the underlying parts of the second body region 9 to grow deeper down into the first body region 8, so that the boundary between the two body regions 8 and 9 will become uneven as in this figure.

Figure 12:
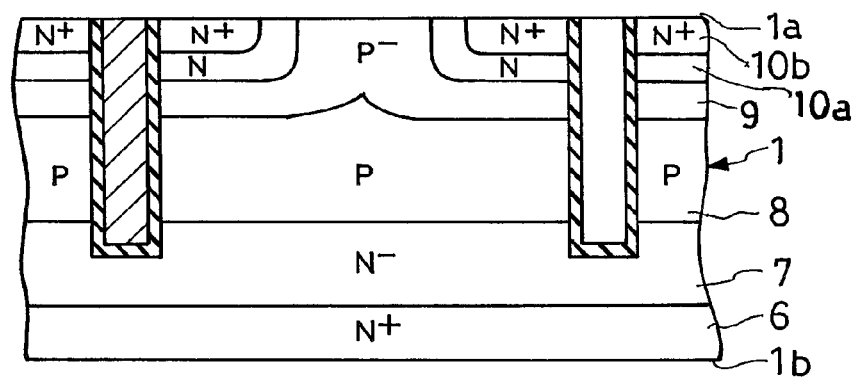
FIG. 12 is a section through the substrate after the creation of the $n^+$-type second source regions therein.

Then the $n^+$-type second source regions $10_b$ are formed in the first source regions $10_a$ as in FIG. 12 by selective diffusion of arsenic or like n-type impurities.

The fabrication of the IGFET is completed with the subsequent creation of the gate insulators 15, drain electrode 2 and source electrode 3 in the prescribed positions seen in FIG. 3.

The first preferred form of IGFET according to the invention, constructed and fabricated as in the foregoing, wins the following advantages:

1. The device integrally incorporates the SBD $D_3$ which is opposite in polarity to the first pn-junction diode $D_1$, efficaciously preventing current flow through any other parts than the channels 13 when the source electrode 3 is higher in potential than the drain electrode 2.

2. Current flow through the channels 13 is controllable in terms of the gate-source voltage both when the source electrode 3 is lower and higher in potential than the drain electrode 2.

3. The second drain region 7 is not exposed at the first major surface of the substrate 1. Consequently, despite the creation of the second body region 9 for providing the SBD $D_3$, and of the first source regions $10_a$ of low impurity concentration for restricting the parasitic npn transistor action arising from the combination of the source, body and drain regions, no extra distance (or no extra thickness of the second drain region 7) is needed between the channels 13 and the first drain region 6. In other words, regardless of the presence or absence of the second body region 9 and first source regions $10_a$ in FIG. 3, the thickness $T_2$ of the second drain region 7 can be kept at a relatively small, constant value (e.g., 1.4 micrometers). The result is a minimal on-resistance of the IGFET according to the present invention. Take for example the prior art planar IGFET of the FIG. 1 construction with a distance of 5.5 micrometers between the first major substrate surface $1_a{}'$ and the first drain region 6', and the IGFET of the FIG. 3 construction according to the present invention with a distance of 5.5 micrometers between the first major substrate surface $1_a$ and the first drain region 6. The on-resistance of the IGFET according to the present invention, capable of withstanding a voltage of 40 volts or so, is approximately a quarter of that of the prior art planar IGFET.

4. The parasitic npn transistor of the IGFET, comprised of the n-type drain region 7, p-type first body region 8, $p^-$-type second body region 9 and n-type first source region $10_a$ is less likely to conduct thanks to the provision of the first source region $10_a$ with an n-type impurity concentration less than that of the second source region $10_b$ and to the pn junction 12 that is smaller in area than that of the prior art IGFET of FIG. 1. The conduction of the parasitic transistor might lead to the destruction of the IGFET. The current that might flow through the parasitic transistor, even if it is not of such magnitude as to cause IGFET destruction, is nevertheless taken as a leakage current, earning, as has been explained earlier herein, a lower rating for the antivoltage strength of the device.

5. The first body region 8 is formed by nonselective diffusion, and both first and second source regions $10_a$ and $10_b$ prevented from lateral expansion by the trenches 11, so that the lateral dimension of each IGFET can be made as small as, say, four micrometers, much less than that (e.g., fourteen micrometers) of the prior art planar IGFET of FIG. 1. This makes the area of the surface $1_a$ of the IGFET substrate 1 according to the invention about 30-40 percent less than that of the same prior art.

6. The two auxiliary switches $S_a$ and $S_b$ make it possible for the IGFET to be turned off when both forward and reverse voltages are applied. Furthermore, by turning on the gate switch $S_g$ while the auxiliary switches $S_a$ and $S_b$ are both held off, the IGFET can be turned on when both forward and reverse voltages are applied. The IGFET according to the present invention may therefore be put to use as a bidirectional or AC switch.

Second Embodiment

The second preferred form of IGFET according to the invention will now be described with reference to FIGS. 13-15, in which parts having corresponding parts in the first disclosed embodiment of FIGS. 3-12 will be identified by using the same reference characters as used to refer to the corresponding parts of the first embodiment.

Figure 13:
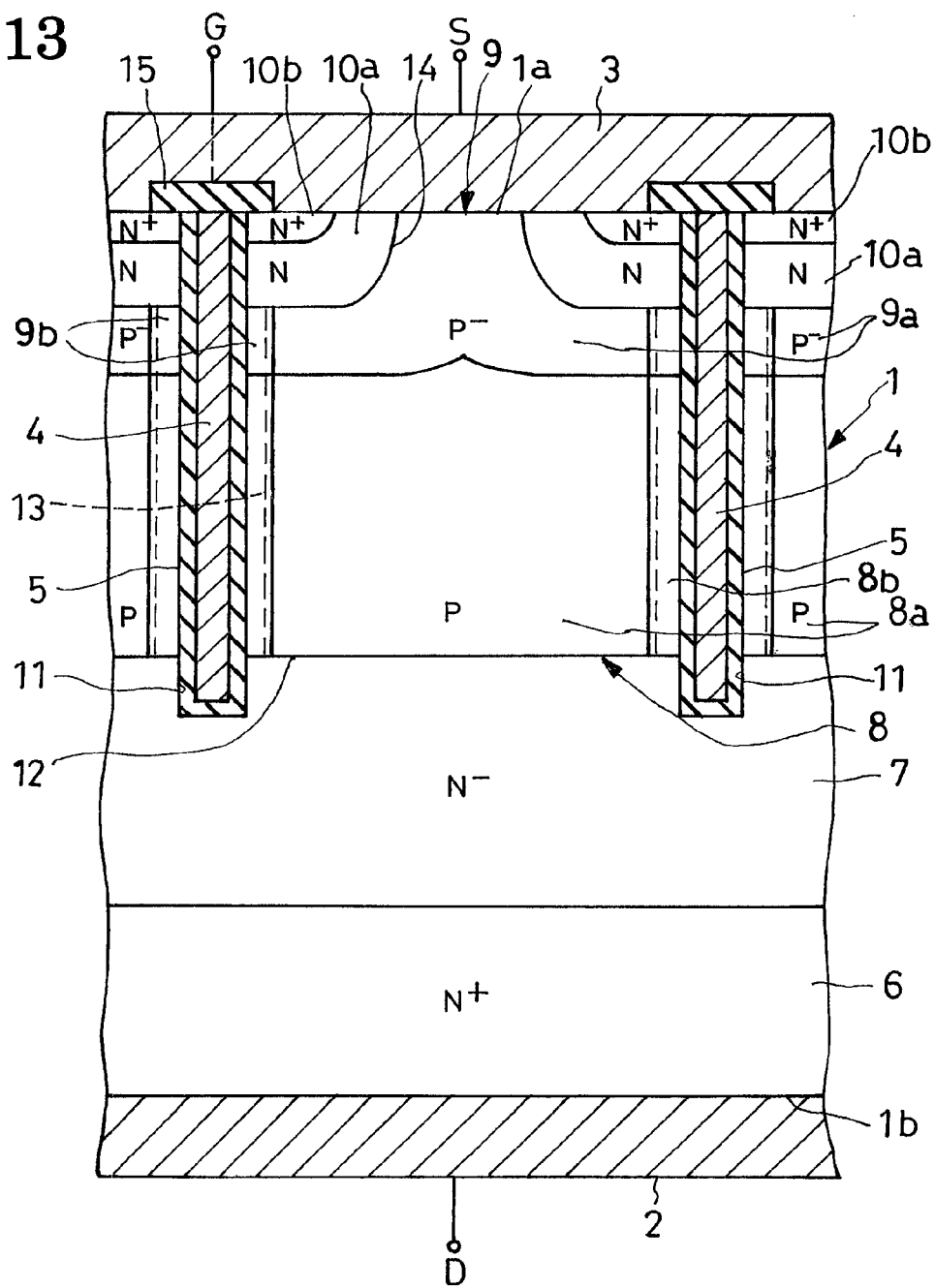
FIG. 13 is a section through a second preferred form of IGFET according to the present invention.

A comparison of FIGS. 3 and 13 will reveal that this second preferred form of IGFET differs from the first preferred form in that the first body region 8 is subdivided into a first body region $8_a$ disposed midway between, and spaced from, each neighboring pair of trenches 11, and a second body region $8_b$ lying alongside the trenches 11 so as to surround the first body region $8_a$. Formed by injection of p-type impurities from within the trenches 11, the second body region $8_b$ is higher in impurity concentration than the first body region $8_a$.

The second body region 9 is likewise subdivided into a first body region $9_a$ disposed between and spaced from each neighboring pair of trenches 11, and a second body region $9_b$ disposed alongside the trenches 11 so as to surround the first body region $9_a$. The second body region $9_b$ is of higher impurity concentration than the first body region $9_a$, being formed concurrently with the first body region $8_a$ by the above injection of the p-type impurities from within the trenches 11. A further difference is that at least the first and the second body regions 8 and 9 have been irradiated with an electron beam.

Designed to make higher the threshold voltage $V_{th}$ of the IGFET, the second regions $8_b$ and $9_b$ of both body regions 8 and 9 are formed by p-type impurity injection along each trench 11 so as to occupy the parts where the channels 13 are to be formed. These second regions $8_b$ and $9_b$ are therefore higher in impurity concentration than the first regions $8_a$ and $9_a$ of the body regions 8 and 9. FIG. 13 shows the second regions $8_b$ of the first body region 8 as extending throughout the length of that portion of each channel 13 which lies in this first body region 8. Alternatively, the second regions $8_b$ of the first body region 8 may be formed only in upper parts of the channel portions in the first body region 8.

The second regions $9_b$ of the second body region 9 are also shown in FIG. 13 as extending throughout the length of those portions of the channels 13 which lies in the second body region 9. Alternatively, the second regions $9_b$ of the second body region 9 may also be formed only in parts of the channel portions in the second body region 9 or may not be provided altogether. Were it not for the $p^-$-type second body region 9, the impurity concentration of the p-type first body region 8, itself formed by impurity diffusion, would diminish from the first source region $10_a$ toward the $n^-$-type second drain region 7. Consequently, the channels would be less easy to be formed in those parts of the first body region 8 which are adjacent the first source region 8 and in which the impurity concentration is higher. The threshold voltage $V_{th}$ would therefore be higher than in the presence of the $p^-$-type second body region 9 as in FIG. 13.

Some electric circuits demand higher threshold voltages for the IGFET. The device of FIG. 13 meets this demand by injecting limited amounts of p-type impurities into the substrate 1 from each trench 11, with the consequent creation of the second regions $8_b$ and $9_b$ of higher impurity concentration in the two body regions 8 and 9. These second regions $8_b$ and $9_b$ make the threshold voltage higher (by approximately one volt than that of the IGFET of FIG. 3) than in the absence of the second regions. These second regions $8_b$ and $9_b$ are so localized that they hardly affect the antivoltage strength and on-resistance of the IGFET.

Figure 14:
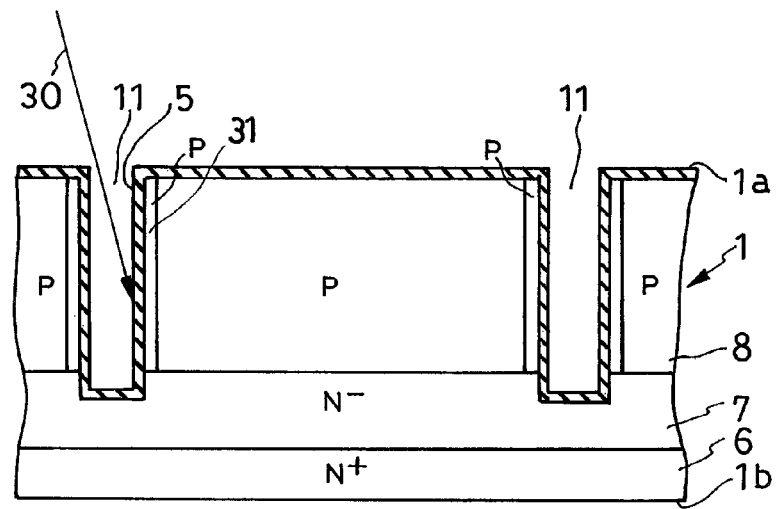
FIG. 14 is a section through the substrate explanatory of how p-type impurities are injected into the substrate.

FIG. 14 is explanatory of how the second regions $8_b$ and $9_b$ of the body regions 8 and 9 are created. After covering the wall surfaces of the trenches 11 with the gate insulator films 5 of silicon oxide, a required amount of p-type impurity ions may be driven into the gate insulator films 5 at an angle indicated at 30 in this figure. Then the injected impurities may be thermally diffused into the substrate 1 thereby forming localized p-type impurity zones 31 alongside each trench 11. The p-type impurities are to undergo some further diffusion to provide the second regions $8_b$ and $9_b$ of the body regions 8 and 9 as in FIG. 13.

Figure 15:
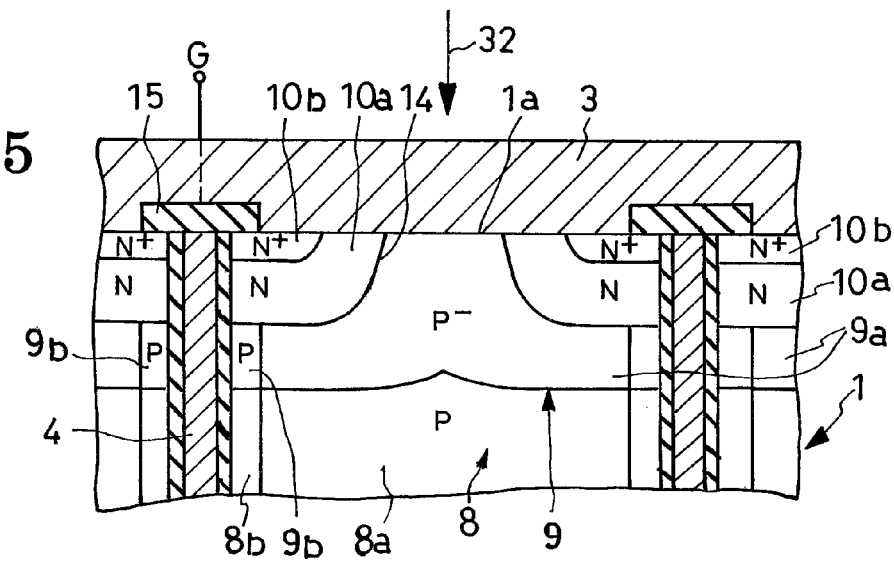
FIG. 15 is a fragmentary section through the substrate explanatory of how the substrate is irradiated with an electron beam.

As indicated by the arrow 32 in FIG. 15, the IGFET of FIG. 13 has its substrate 1 irradiated with an electron beam of, for example, two mega electron volts (MeV) for a predetermined period of time through the source electrode 3 and thereafter subjected to heat treatment of, for example, 300° C. or more. This heat treatment is intended to recover the substrate from damage that may have occurred at the interface between silicon and silicon oxide by the electron beam irradiation.

The electron beam irradiation of the substrate leads to the shortening of the lifetime of the minority carriers in both body regions 8 and 9. As a consequence, during the application of a reverse voltage to the IGFET, the electrons (minority carriers) that have been driven from the $n^-$-type second drain region 7 into the two body regions 8 and 9 will quickly combine with the holes and be so prevented from flowing into the n-type first source region $10_a$. Thus the IGFET will have less leakage current for a higher antivoltage strength rating. If the lifetime of the minority carriers in the body regions 8 and 9 shortens to one tenth, for instance, then the antivoltage strength of the IGFET will jump from 15 volts to 21 volts.

It is not a necessity that the substrate 1 be wholly irradiated with an electron beam; instead, only localized part of the substrate may be irradiated. Further, as required or desired, gold or like lifetime killers may be distributed in the body regions 8 and 9.

This second embodiment offers the advantages of a higher threshold voltage and shorter lifetime of minority carriers. Also, the second embodiment gains all the advantages listed in connection with the first embodiment.

Third Embodiment

Figure 16:
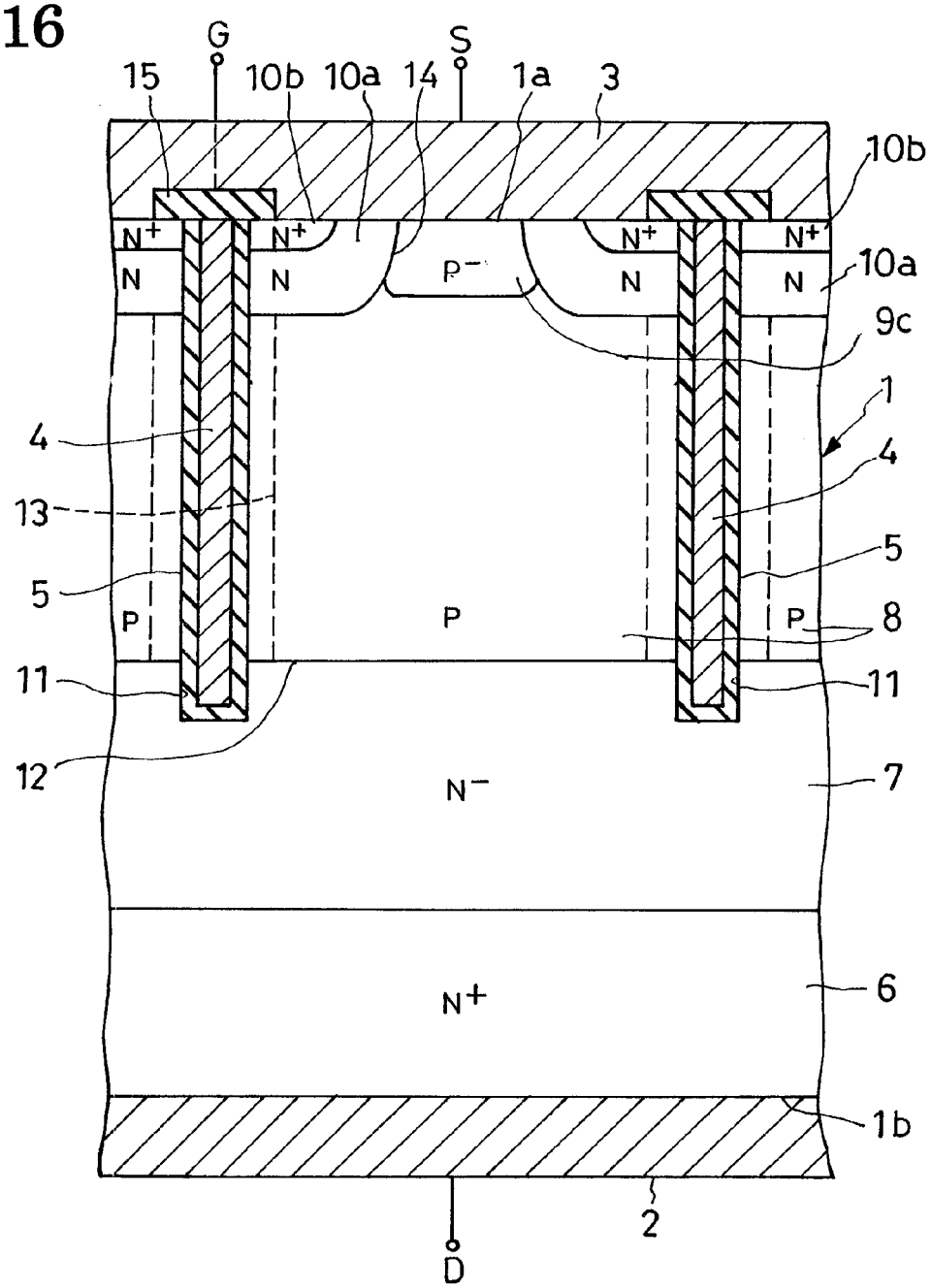
FIG. 16 is a section through a third preferred form of IGFET according to the present invention.
Figure 17:
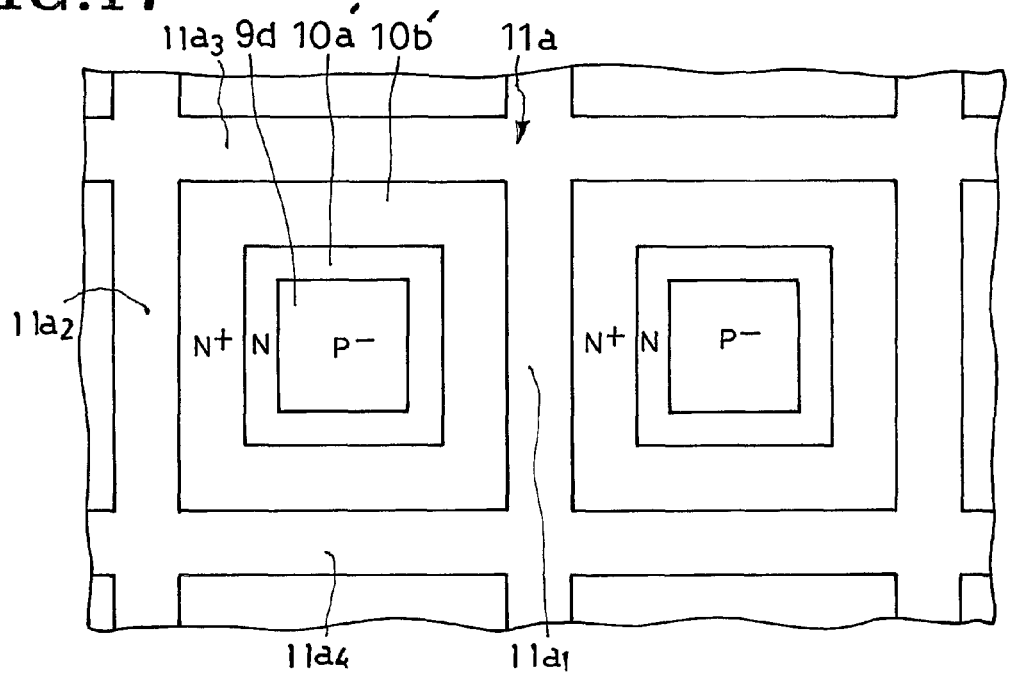
FIG. 17 is a plan view of a semiconductor substrate having trenches cut therein in a different arrangement from that in the foregoing embodiments.
Figure 18:
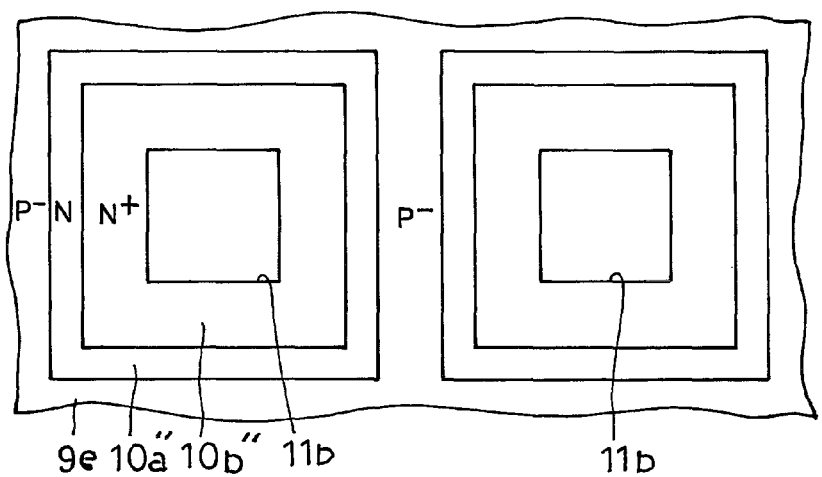
FIG. 18 is a plan view of a semiconductor substrate having wells cut therein in substitution for the trenches of the foregoing embodiments.

The IGFET shown in FIG. 16 is akin in construction to that of FIG. 3 except that a modified $p^-$-type second body region $9_c$ is adopted in substitution for the second body region 9 of the latter. The modified second body region $9_c$, although exposed at the first major surface $1_a$ of the substrate 1, is spaced from both of the neighboring pair of trenches 11. Being designed to provide an SBD in combination with the source electrode 3, the second body region $9_c$ confined midway between the pair of trenches 11 as in FIG. 16, serves its purpose just as well as its counterpart 9 of the FIG. 3 embodiment.

In this embodiment too, as in that of FIG. 13, the first body region 8 could be provided with the equivalents of the second body regions $8_b$ of higher impurity concentration alongside the trenches 11. The lifetime of the minority carriers in the body regions 8 and $9_c$ might also be shortened by irradiating the substrate 1 with an electron beam.

Possible Modifications

The present invention is not to be limited by the exact details of the illustrated embodiments of the invention but admits of modifications such as the following:

1. The parallel trenches of FIG. 4 are modifiable into a latticework of trenches illustrated at $11_a$ in FIG. 17. Each space defined by the latticed trenches $11_a$ may contain the required parts of IGFETs such as the $p^-$-type second body region $9_d$, n-type first source region $10_a'$, $n^+$-type second source region $10_b'$, etc. Each opposed pair of limbs of the latticed trenches $11_a$, such as indicated at $11_{a1}$ and $11_{a2}$, and $11_{a3}$ and $11_{a4}$, serve as the pair of trenches for providing a unit IGFET.

2. The trenches of FIG. 4 are modifiable into a series or array of upstanding trenches or wells seen at $11_b$ in FIG. 18. Each trench $11_b$ may be surrounded by an $n^+$-type second source region $10_b''$, n-type first source region $10_a''$, and $p^-$-type second body region $9_e$.

3. Instead of creating the n-type first source region $10_a$ and $n^+$-type second source region $10_b$ by two different steps of impurity diffusion as in the illustrated embodiments, only one step of impurity diffusion may be adopted to form a single source region in which the n-type impurity concentration diminishes from the substrate surface $1_a$ toward the pn junction 14.

What is claimed is:
1. An insulated-gate field-effect transistor comprising:
(a) a semiconductor substrate having a first and a second opposite major surface extending parallel to each other, and at least a pair of trenches extending from the first major surface of the substrate and terminating short of the second major surface of the substrate;
(b) a drain region of a first conductivity type having a surface exposed at the second major surface of the substrate and having a thickness not less than a spacing between the second major surface of the substrate and each of the trenches;
(c) a first body region of a second conductivity type with a first prescribed impurity concentration, the first body region being disposed contiguous to both the drain region and the trenches so as to prevent the drain region from being exposed at the first major surface of the substrate between the pair of trenches;
(d) a second body region of the second conductivity type with a second prescribed impurity concentration less than the first prescribed impurity concentration, the second body region being disposed between the pair of trenches and contiguous to the first body region and having a surface exposed at the first major surface of the substrate;
(e) a source region of the first conductivity type disposed between the pair of trenches and contiguous to both the second body region and the trenches, the source region having a surface exposed at the first major surface of the substrate;
(f) a drain electrode disposed on the second major surface of the substrate in ohmic contact with the drain region;
(g) a source electrode disposed on the first major surface of the substrate in ohmic contact with the source region and in schottky contact with the second body region;
(h) a gate insulator in each trench; and
(i) a gate electrode received in each trench via the gate insulator and held opposite those parts of the substrate where channels are to be formed.

2. An insulated-gate field-effect transistor as defined in claim 1, wherein the drain region comprises;
(a) a first drain region having a surface exposed at the second major surface of the substrate, the first drain region being less thick than the spacing between the second major surface of the substrate and each of the trenches; and
(b) a second drain region contiguous to the first drain region, the second drain region being less in first conductivity type impurity concentration than the first drain region and having a thickness not less than a distance between the first drain region and each trench;
(c) the trenches in the substrate being each thick enough to reach the second drain region.

3. An insulated-gate field-effect transistor as defined in claim 1, wherein the source region comprises:
(a) a first source region contiguous to both the second body region and the trenches and having a surface exposed at the first major surface of the substrate; and
(b) a second source region of higher impurity concentration than the first source region, the second source region being contiguous to the first source region and having a surface exposed at the first major surface of the substrate.

4. An insulated-gate field-effect transistor as defined in claim 2, wherein the second drain region has a thickness less than a distance between the first major surface of the substrate and a pn junction between the second drain region and the first body region.

5. An insulated-gate field-effect transistor as defined in claim 1, wherein the first body region comprises:
(a) a first body region disposed between and spaced from the pair of trenches; and
(b) a second body region disposed alongside the pair of trenches, the second body region being higher in second conductivity type impurity concentration than the first body region.

6. An insulated-gate field-effect transistor as defined in claim 1, wherein the first and the second body region are regions where the lifetime of minority carriers has been shortened by electron beam irradiation.

7. An insulated-gate field-effect transistor as defined in claim 1, further comprising:
(a) a gate control circuit for delivering to the gate electrode a gate control signal for selectively causing conduction between the drain electrode and the source electrode;
(b) first auxiliary switch means for short-circuiting the source electrode and the gate electrode in order to cause nonconduction between the drain electrode and the source electrode when the drain electrode is higher in potential than the source electrode; and
(c) second auxiliary switch means for short-circuiting the drain electrode and the gate electrode in order to cause nonconduction between the drain electrode and the source electrode when the drain electrode is less in potential than the source electrode.

* * * * *